(12) United States Patent
Hsu et al.

(10) Patent No.: US 10,491,217 B2
(45) Date of Patent: Nov. 26, 2019

(54) LOW-POWER CLOCK GATE CIRCUIT

(71) Applicant: Intel Corporation, Santa Clara, CA (US)

(72) Inventors: Steven Hsu, Lake Oswego, OR (US); Amit Agarwal, Hillsboro, OR (US); Simeon Realov, Portland, OR (US); Iqbal Rajwani, Roseville, CA (US); Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/059,905

(22) Filed: Aug. 9, 2018

(65) Prior Publication Data

US 2019/0044511 A1 Feb. 7, 2019

(51) Int. Cl.
*H03K 19/00* (2006.01)
*G06F 17/50* (2006.01)

(52) U.S. Cl.
CPC ..... *H03K 19/0016* (2013.01); *G06F 17/5045* (2013.01)

(58) Field of Classification Search
CPC .................. G06F 17/5045; H03K 19/0016
See application file for complete search history.

(56) References Cited

U.S. PATENT DOCUMENTS

| 7,598,784 | B2* | 10/2009 | Hunter | H03K 5/156 327/112 |
| 2003/0107415 | A1* | 6/2003 | Nguyen | G06F 1/08 327/115 |
| 2008/0222469 | A1* | 9/2008 | Rickert | G01R 31/318533 714/726 |
| 2013/0076422 | A1* | 3/2013 | Tang | G06F 1/10 327/218 |
| 2014/0184271 | A1* | 7/2014 | Gurumurthy | H03K 19/0016 326/93 |
| 2018/0062658 | A1* | 3/2018 | Hsu | H03K 19/0013 |

* cited by examiner

*Primary Examiner* — Alexander H Taningco
*Assistant Examiner* — Kurtis R Bahr
(74) *Attorney, Agent, or Firm* — Green, Howard, & Mughal LLP

(57) ABSTRACT

An apparatus is provided which comprises: a first inverter to receive a clock; a pass-gate coupled to the first inverter; a second inverter coupled to the pass-gate and to provide an output clock; and a device coupled to the second inverter and the pass-gate, wherein the transistor and the pass-gate are controllable by a logic that depends on logic values of at least two signals (e.g., an enable and the clock).

17 Claims, 12 Drawing Sheets

| ICG Type | $T_{clk2out0 \to 1}$ (ps) | $T_{clk2out1 \to 0}$ (ps) | $T_{dtsetupps0 \to 1}$ (ps) | $T_{dtsetupps1 \to 0}$ (ps) | $BHT_{0 \to 1}$ (ps) | $T_{clkslope0 \to 1}$ (ps) | $T_{clkslope1 \to 0}$ (ps) |
|---|---|---|---|---|---|---|---|
| Fig. 1 | 1.00 | 1.00 | 1.00 | 1.00 | 1.00 | 1.00 | 1.00 |
| Fig. 2 | 1.42 | 1.10 | 0.65 | 1.06 | 0.98 | 1.52 | 1.16 |
| Fig. 3 | 1.45 | 1.37 | 0.68 | 1.13 | 1.01 | 1.15 | 1.24 |
| Fig. 4 | 1.47 | 1.27 | 0.59 | 0.46 | 0.97 | 1.81 | 1.59 |

| ICG Type | Average Delay | Average Power | Clock pin-cap | Area | Drive Strength |
|---|---|---|---|---|---|
| Fig. 1 | 1.00 | 1.00 | 1.00 | 1.00 | 1.0 |
| Fig. 2 | 0.87 | 1.05 | 0.57 | 0.75 | 0.5 |
| Fig. 3 | 0.92 | 0.86 | 0.57 | 0.75 | 1.0 |
| Fig. 4 | 0.52 | 1.26 | 0.29 | 0.75 | 0.5 |

LOW-POWER CLOCK GATE CIRCUIT

BACKGROUND

A major component of digital system power dissipation is due to charging and discharging load capacitance of circuit nodes, otherwise known as dynamic power. In today's clocked synchronous systems—microprocessors, digital signal processors (DSP's), and system-on-chips (SoC's) in smartphones, tablets, laptops, and servers, a large percentage of the overall power dissipation (e.g., greater than 45%) is in the clock distribution grid and final sequential load seen by the clock.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
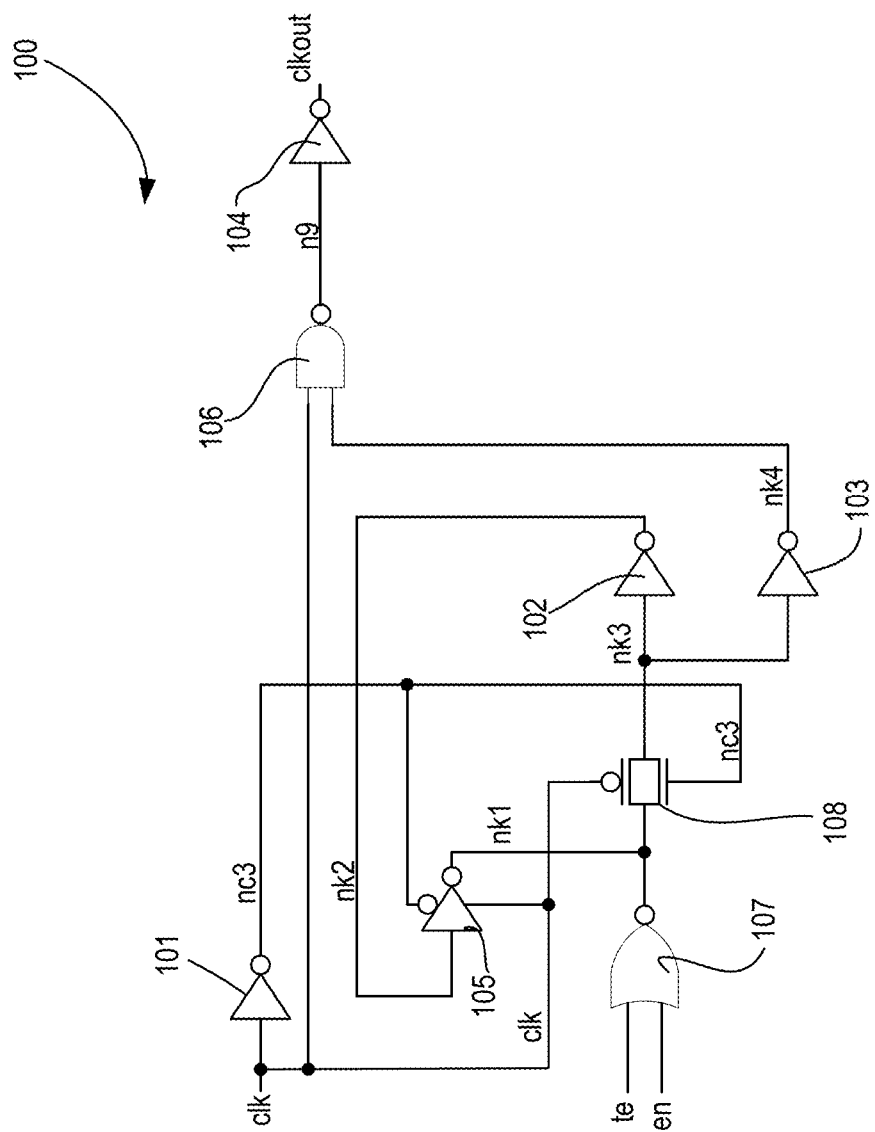
FIG. 1 illustrates an integrated clock gate (ICG) circuit with AND logic.

To reduce power, integrated clock gates (ICG) are used in many synchronous circuits to reduce dynamic power dissipation. Clock gating reduces power by including logic to shut-off portions of the clock tree, flip-flops, and logic data-path when not active. The term "clock gate" generally refers to a circuitry which is used to stop the toggling of a clock signal (e.g., a periodic signal) using a control signal. By stopping the toggling of the clock signal or by shutting off the clock propagation, dynamic power is reduced in circuits (e.g., flip-flops in the shut-off logic portions) that use that clock signal. The flip-flops in the shut-off logic portions do not have to switch states or nodes, thereby saving power. Therefore, it is desirable to design these integrated clock gates for low power consumption, since they consume an incremental power overhead in order to enable clock gating.

However, these clock gates add additional clock load to the high-activity un-gated portions of the clock grid, so the clock power contribution is very high even though there are fewer ICG instances. Often, clock gating enabled timing paths are difficult and critical in a design, so the setup time is crucial to achieve maximum clock gating efficiency and to meet frequency targets.

Some embodiments describe a family of integrated clock gate (ICG) circuits using pass-gates to perform AND and OR functions to reduce clock power and/or pin capacitance (pin-cap) and improve setup-time. The integrated clock gate circuits of various embodiments are fully interruptible without contention. In some embodiments, when integrated clock gate circuits are implemented as Complementary Metal Oxide Semiconductor (CMOS) devices, they enable robust low voltage operation and tolerance to process variations. The pass-gate based AND ICG combines the advantages of the conventional AND and OR ICGs, without the disadvantages of each. Also, in some cases, the new pass-gate OR ICG is the fastest setup time ICG and has the lowest clock pin-cap.

There are many technical effects of various embodiments. For example, the pass-gate based ICG AND circuit reduces clock power by up to 23% lower power vs. the conventional OR ICG. The pass-gate based ICG AND circuit reduces clock-pin cap. For example, the clock-pin cap is reduced from seven diffusion grids (7 DG) to 4 DG (same as conventional OR ICG) vs. the conventional AND ICG. The pass-gate based ICG AND circuit improves setup-times vs. conventional AND ICG (comparable to the conventional OR ICG). The pass-gate based ICG AND circuit provides similar output drive strength as conventional AND ICG since the output driver of the pass-gate based ICG AND circuit is an inverter. The pass-gate based ICG OR circuit provides the fastest setup time ICG with lowest clock pin-cap, suitable for critical paths and increasing clock gating efficiency. The pass-gate based ICG AND circuit and pass-gate based ICG OR circuit, when implemented with the same sized cells as with conventional ICG circuit, is area neutral to the conventional OR ICG and smaller (e.g., 23% smaller) than the conventional AND ICG circuit. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

It is pointed out that those elements of the figures having the same reference numbers (or names) as the elements of any other figure can operate or function in any manner similar to that described but are not limited to such.

Here, the term "setup time" generally refers to the minimum amount of time the data input should be held steady before the clock event, so that the data is reliably sampled by the clock.

Here, the term "hold time" is the minimum amount of time the data input should be held steady after the clock event, so that the data is reliably sampled by the clock.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates an integrated clock gate (ICG) circuit 100 with AND logic. ICG 100 comprises inverters 101, 102, 103, and 104, tristate-able inverter 105, NAND gate 106, NOR gate 107, and pass-gate 108 coupled together as shown. The ICG 100 receives three input signals—clock (clk), test enable (te), and enable (en); and provides one clock output (clkout). Here, a latch is formed by tristate-able inverter 105, node nk1, pass-gate 108, node nk3, inverter 102, and node nk2, where the latch is written into through pass-gate 108. The NOR gate 107 provides hooks for testability, while the AND gate (implemented as NAND 106 together with inverter 104) provides for an output driver to drive clkout.

When en=0, the un-gated clock node clk switches nine diffusion grids (DG) due to the latch, local clock inverter 101 driving node nc3, and NAND gate 106. When en=1, the clock clk switches a total of 13 DG because the entire AND gate (nodes n9 and clkout) is switching in addition to the latch. The NOR gate 107 with the te signal input is included to allow a test mode during debug to turn-off the clock gating feature. When te=0, the test mode is off, so the en signal (enable) independently controls the clock gate. When te=1, the clock gate is forced to always allow the clock to propagate regardless of the en signal value. The clock pin-cap (clk) is seven DG, and it causes back propagated clock power increase and also contributes to a higher un-gated high activity clock power. One advantage of this type of ICG is that it has a good output drive strength for high fan-out clock nodes, since clkout is driven with inverter 104.

Figure 2:
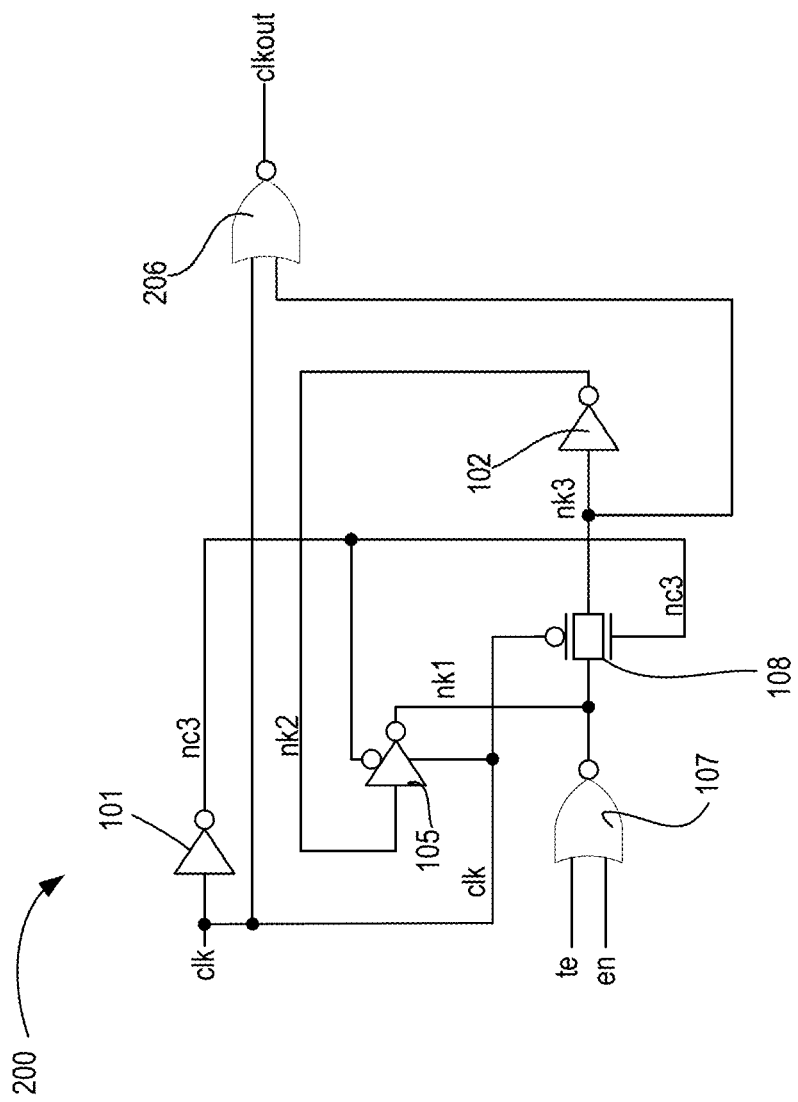
FIG. 2 illustrates an ICG circuit with OR logic.

FIG. 2 illustrates ICG 200 with OR logic. ICG 200 comprises inverters 101 and 102, tristate-able inverter 105, NOR gates 107 and 206, and pass-gate 108 coupled together as shown. The ICG 200 receives three input signals—clock (clk), test enable (te), and enable (en); and provides one clock output (clkout). Here, a latch is formed by tristate-able inverter 105, node nk1, pass-gate 108, node nk3, inverter 102, and node nk2, where the latch is written into through pass-gate 108. The NOR gate 107 provides hooks for testability, while the NOR gate 206 provides for an output driver to drive clkout.

When en=0, the un-gated clock node clk switches 10 diffusion grids (DG) due to the latch, local clock inverter 101 driving node nc3, and input pin-cap of NOR gate 206.

When en=1, the clock clk switches a total of 10 DG, but the clkout signal switches in addition. Since the local clock inverter 101 creates the inverted clock (nc3) for the latch and also drives the input of NOR gate 206, this reduces the clock pin-cap (clk) to 4 DG and back propagated clock power. Also, the ICG 200 switches less clock gate DG when the en=0 vs. the AND ICG 100. This saves power depending on the enable probability and activity. Furthermore, this type of clock gate improves the setup time vs. the AND ICG 100.

However, AND ICG 100 results in high clock-pin cap (at circuit node clk) and most number of clock transistors. The AND ICG 100 may not share the local clock inverter (that drives node nc3) functionality like the other circuits. Also, the setup time for the AND ICG 100 is slower than the other types. One disadvantage of the OR ICG 200 is that it has a poor output drive strength, and is merely suitable to drive smaller clock loads on node clkout.

Various embodiments disclose a family of integrated clock gate circuits using pass-gates to perform AND and OR functions to reduce clock power/pin-cap and improve the setup-time. The ICGs of various embodiments are fully interruptible without contention, and static CMOS implementation enables robust low voltage operation and tolerance to process variations. The pass-gate AND ICG of some embodiments combines the advantages of the AND and OR ICGs 100 and 200, respectively, without the disadvantages of each. Also, the pass-gate OR ICG of some embodiments provides the fastest setup time ICG and has the lowest clock pin-cap.

Figure 3:
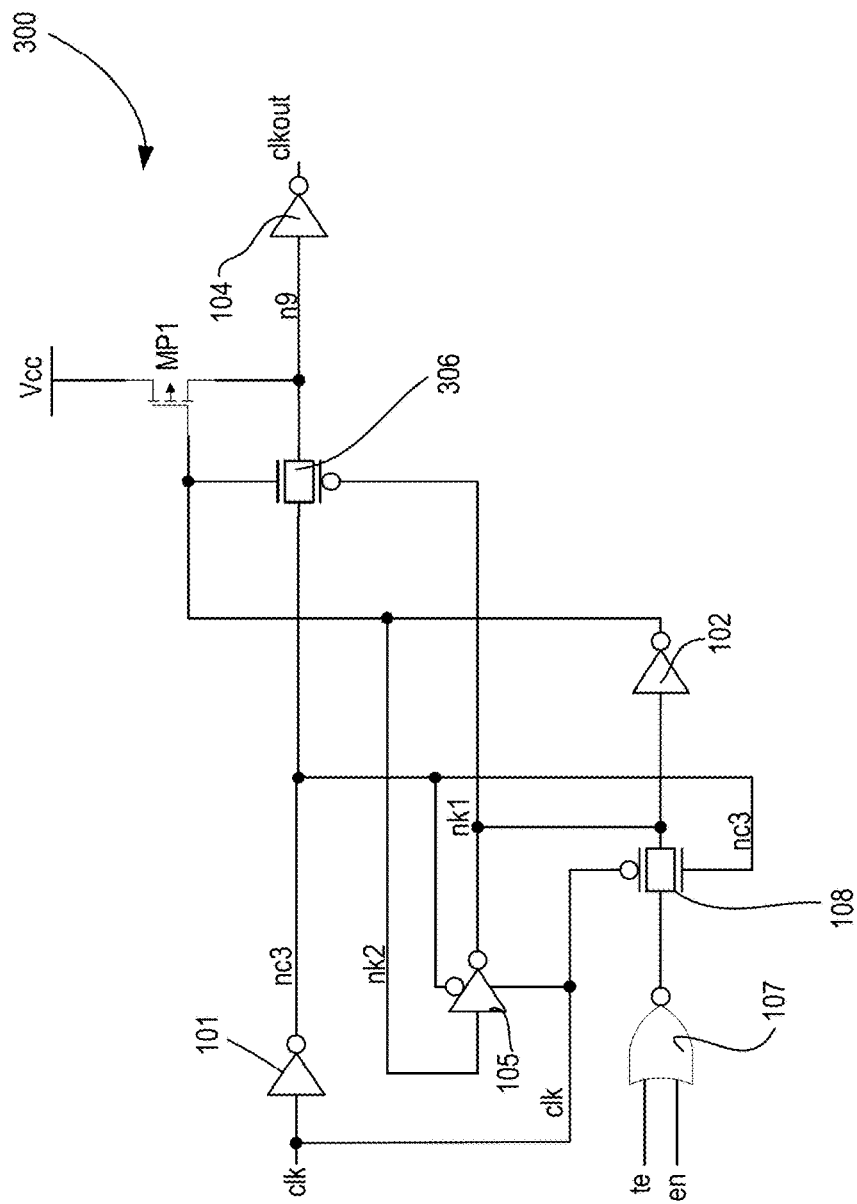
FIG. 3 illustrates a pass-gate based ICG circuit with AND logic, in accordance with some embodiments.

FIG. 3 illustrates a pass-gate based ICG circuit 300 with AND logic, in accordance with some embodiments. In some embodiments, ICG 300 comprises inverters 101, 102, and 104, tristate-able inverter 105, NOR gate 107, pass-gates 108 and 306, and p-type transistor MP1 coupled together as shown. ICG 300 comprises a latch with a NOR input for testability, and a AND gate to drive the clock output. However, the AND gate is implemented with a CMOS pass-gate and a pull-up p-type device MP1 connected to node n9. This allows the local clock inverter 101 of the latch that drives node nc3 to also feed the pass-gate 306 to perform the correct logic function, reducing the number of clock devices.

When en=0, the un-gated clock node clk switches six diffusion grids (DG) due to the latch. When en=1, the clock switches a total of ten DG because the pass-gate 306 is open and the output inverter 104 is switching, allowing the clock to propagate through depending on the latch state. The clock pin-cap (clk) is four DG and has an improved setup time, like the OR ICG 200. Also, ICG 300 has a good drive strength since the output driver is an inverter 104, like the AND ICG 100. In some embodiments, the test enable (te) or test mode is disabled. For example, the te node is hard tied to ground or supply depending on the type of logic 107 (NAND, NOR, XOR, etc.). In some embodiments, te or test mode can be changed dynamically using an operating system, scan-chain or other debugging circuitries.

Figure 4:
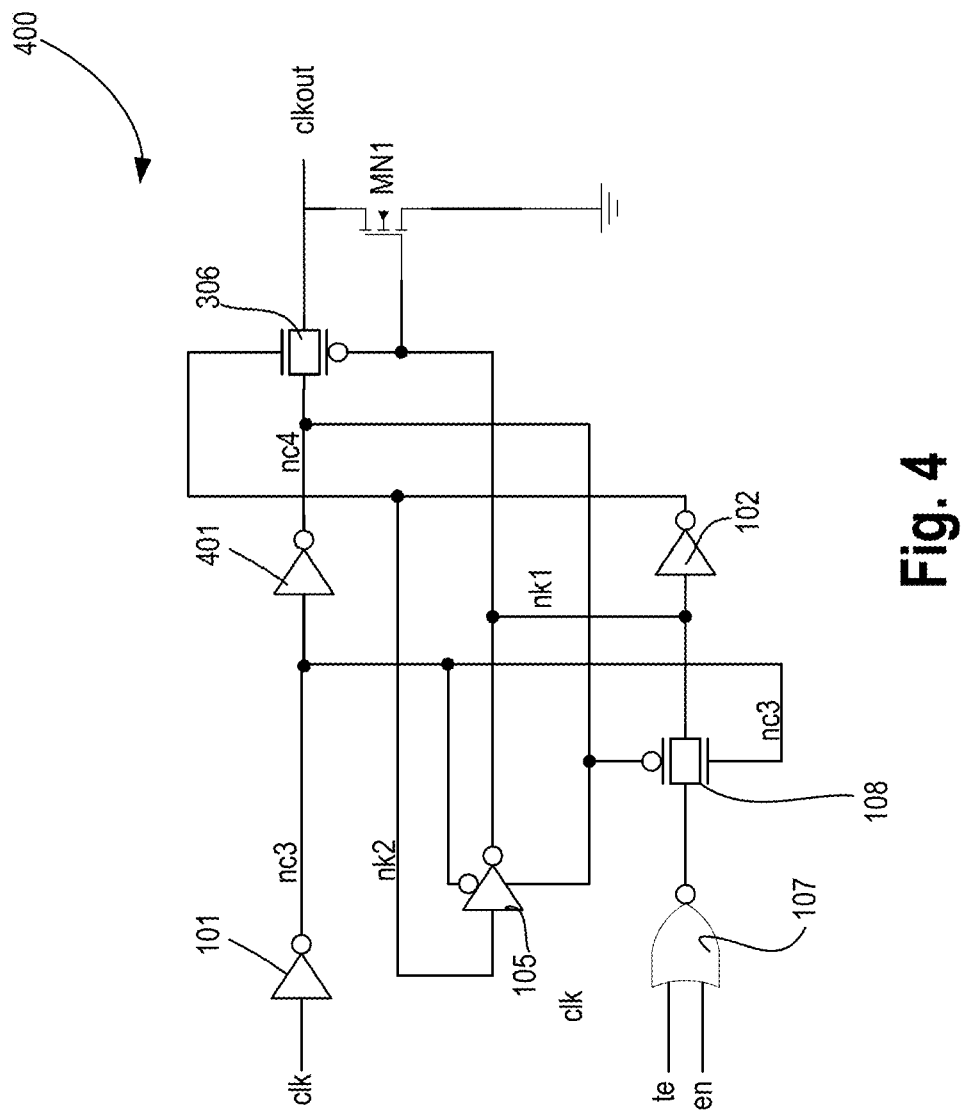
FIG. 4 illustrates a pass-gate based ICG circuit with OR logic, in accordance with some embodiments.

FIG. 4 illustrates a pass-gate based ICG 400 circuit with OR logic, in accordance with some embodiments. In some embodiments, ICG 400 comprises inverters 101, 102, and 401, tristate-able inverter 105, NOR gate 107, pass-gates 108 and 306, and n-type transistor MN1 coupled together as shown. ICG 400 comprises of a latch with a NOR input for testability, and an OR gate to drive the clock output. However, the OR gate is implemented using a pass-gate 306 and a pull-down n-type device MN1 connected to the clkout node. This allows the two local clock inverters 101 and 401 (driving nodes nc3 and nc4, respectively) of the latch to also feed the pass-gate 306 to perform the correct logic function, reducing the clock pin-cap to merely a single clock inverter.

When en=0, the un-gated clock node clk switches ten diffusion grids (DG) due to the latch. When en=1, the clock switches a total of ten DG and clkout node switches too. The clock pin-cap (clk) is the lowest at two DG and exhibits the best setup time out of the four circuits.

Figure 5:
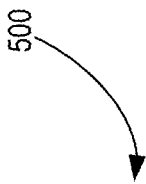
FIG. 5 illustrates a table showing timing comparison between various ICG types, in accordance with some embodiments.

FIG. 5 illustrates Table 500 showing timing comparison between various ICG types, in accordance with some embodiments. Table 500 shows a summary of the clock2out, enable and disable setup times for en, and output slopes on clkout of all four different types of integrated clock gates for a particular process, temperature, and voltage condition using extracted layout parasitic capacitances. Here the term "$T_{dslope}$" refers to the slope of a signal in picoseconds (ps), "$T_{clkslope}$" refers to the slope of the clock in ps, "$T_{clk2out0 \to 1}$" refers to the propagation delay from node clk to output as the clock transitions from low (0) to high (1), "$T_{clk2out0 \to 1}$" refers to the propagation delay from node clk to output as the clock transitions from high (1) to low (0), "$T_{dtsetupps0 \to 1}$" refers to the setup time when data transitions from low (0) to high (1), "$T_{dtsetupps1 \to 0}$" refers to the setup time when data transitions from high (1) to low (0), "$BHT_{0 \to 1}$" refers to the block hole time (BHT) when data transitions from low (0) to high (1), "$T_{clkslope0 \to 1}$" refers to the clock slope when clock transitions from low (0) to high (1), and "$T_{clkslope1 \to 0}$" refers to the clock slope when clock transitions from high (1) to low (0).

The simulations show that the fastest ICG is the PG OR ICG 400. The simulations also show that the PG AND ICG 300 has comparable setup times to the OR ICG 200, but with improved output clock slopes that are similar to the AND ICG 100.

Figure 6:
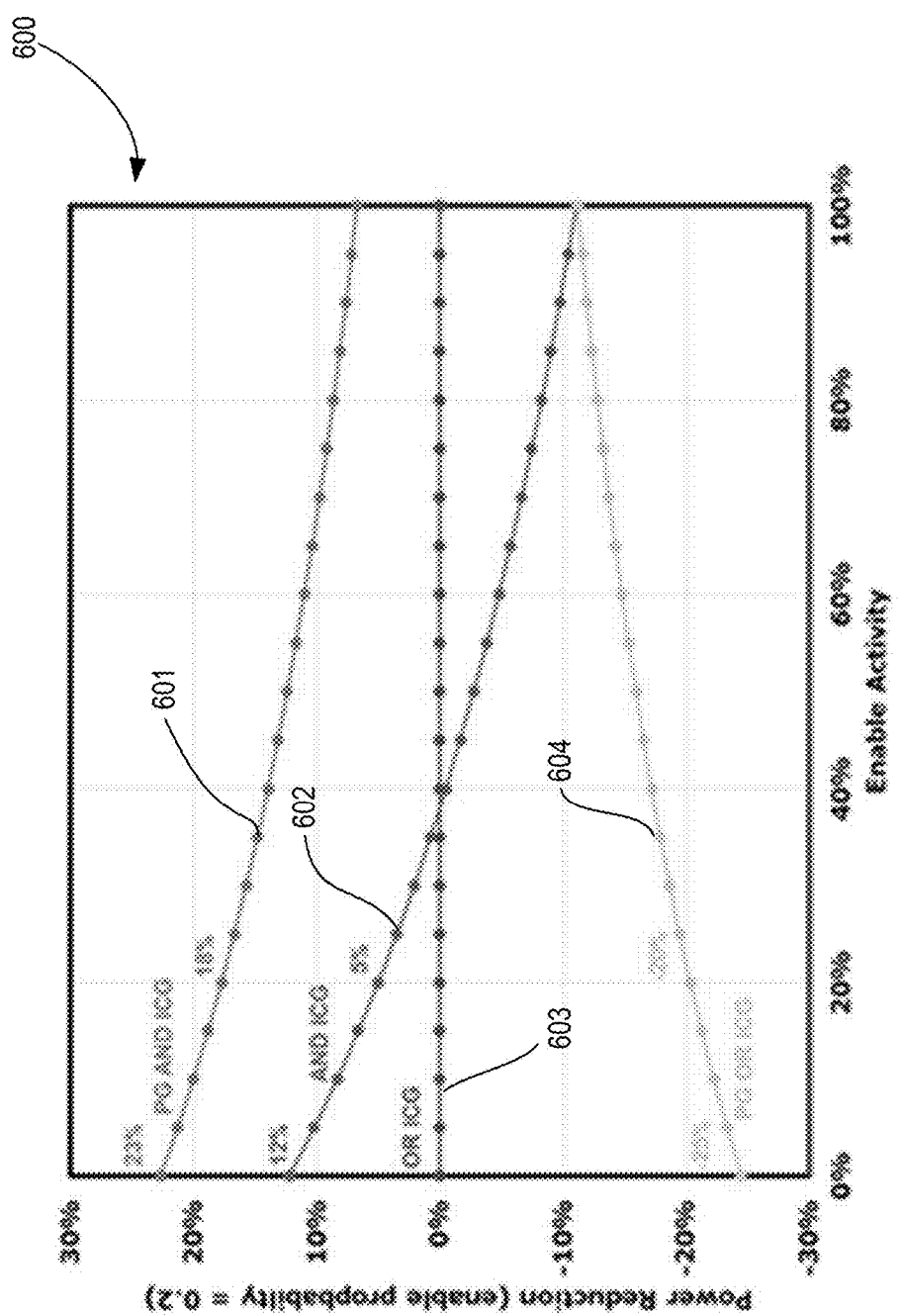
FIG. 6 illustrates a plot showing power comparison between circuits of FIGS. 1-4, in accordance with some embodiments.

FIG. 6 illustrates plot 600 showing power comparison between circuits of FIGS. 1-4, in accordance with some embodiments. Here, the x-axis is the enable activity in percentage while the y-axis is power reduction with enable probability of 0.2. The enable probability is the fraction of entire time that the enable is 1. The chart shows that for lower enable activities the AND ICG 100 is lower power than the OR ICG 200 (e.g., comparing waveforms 602 and 603). The PG AND ICG 300 consumes the lowest power of all 4 circuits, regardless of enable activity as indicated by waveform 601. The PG OR ICG 400 does consume more power as indicated by waveform 604, but this does not include any savings from the back propagated clock power due to the clock pin-cap reduction.

Figure 7:
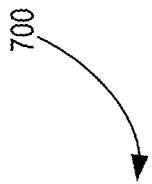
FIG. 7 illustrates a table showing various performance parameters between various ICG types, in accordance with some embodiments.

FIG. 7 illustrates Table 700 showing various performance parameters between various ICG types, in accordance with some embodiments. Table 700 shows a summary of the normalized average delay (setup time), average power, clock pin-cap, area, and drive strength. Here, the term "average delay" generally refers to the average setup time, the term "average power" refers to the average power in watts for the circuit at 0.2 enable probability and 0.1 enable activity, the term "clock pin-cap" refers to the capacitance at the clock pin or circuit node, the term "area" refers to area of the circuit or standard cell, and the term "drive strength" refers to the slope from high to low at the output node. The term "drive strength" may also refer to the relative strength of the output depending on whether the configuration is a stacked configuration.

As the table shows, the AND ICG 100 has good drive strength, while the OR ICG 200 has good delay, clock pin-cap, and area. However, the PG AND ICG 300 has best of average delay, clock pin-cap, area, and drive strength between both ICGs 100 and 200, while consuming the lowest power. For integrated clock gates, the setup time is the most critical delay metric, since the clock-Q delay is matched for all clock gates between pipeline stages. Since the PG OR ICG 400 is the fastest ICG, it potentially can be used where clock gating could not be performed due to an enable setup time being critical, thus yielding lower power overall for the system.

Figure 8:
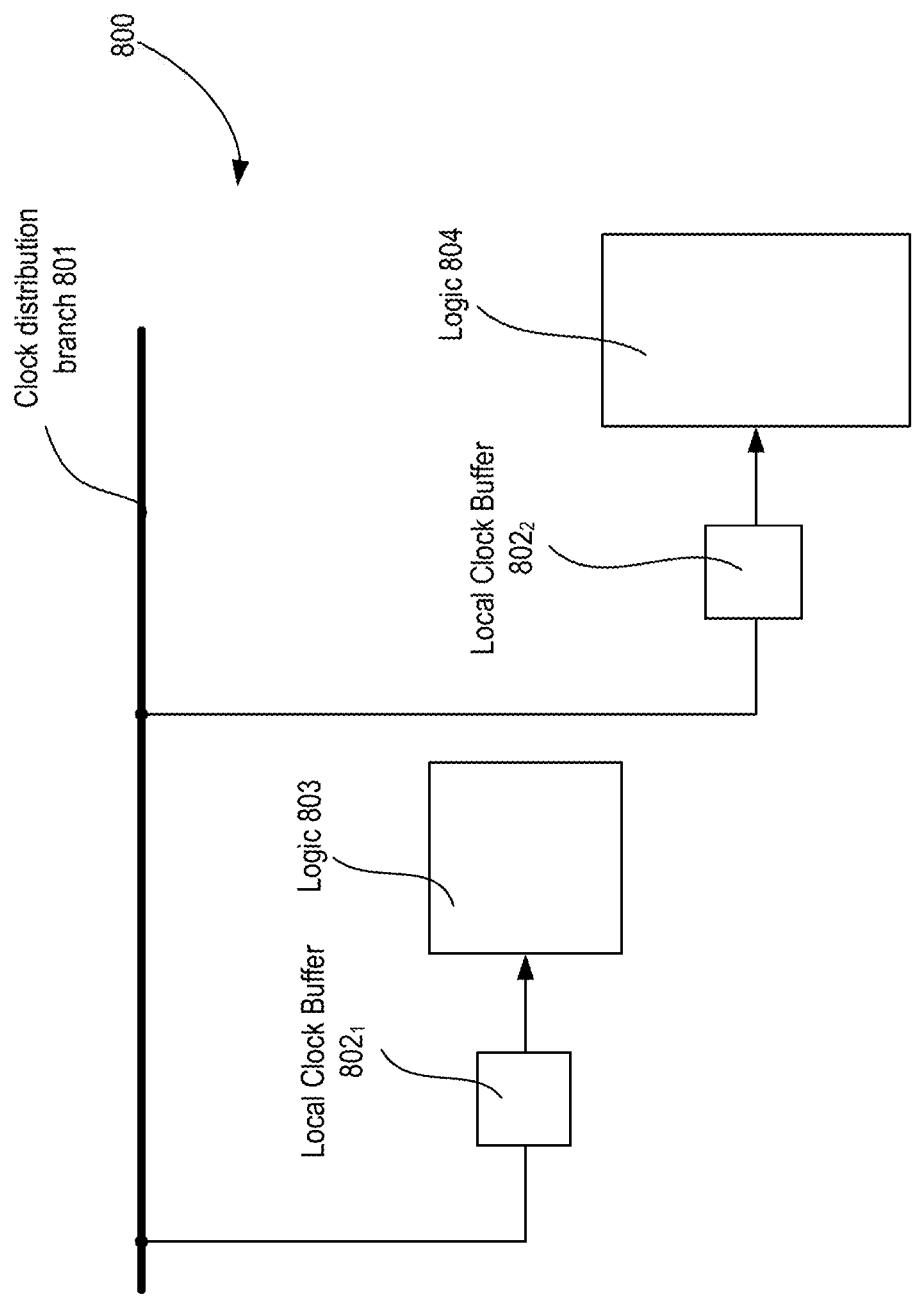
FIG. 8 illustrates a clock distribution network with clock gating buffers, in accordance with some embodiments.

FIG. 8 illustrates a clock distribution network 800 with clock gating buffers, in accordance with some embodiments. FIG. 8 illustrates one typical use of the clock gating buffers. In this example, a portion of a clock distribution network is shown with a clock distribution branch 801 providing an ungated clock to local clock buffers $802_1$ and $802_2$. For simplicity sake, two local clock buffers are shown. However, the embodiments can be extended to any number of clock buffers. In some embodiments, the clock buffers are one of ICGs 300 and 400. However, in some embodiments, other ICGs 100 and 200 can also be combined in the same processor as ICGs 300 and 400. The clock buffers are used to provide clock gating functionality for logics 803 and 804, respectively, which include circuits (e.g., latches, flip-flops, registers, etc.) that use the clock outputs from the respective buffers. As such, the dynamic power consumption of the logics 802 and 803 can be reduced by gating the clocks to them by clock buffers $802_{1-2}$, respectively. The ICGs in the clock distribution network 800 may also include embodiments of ICGs discussed with reference to FIGS. 9-11.

Figure 9:
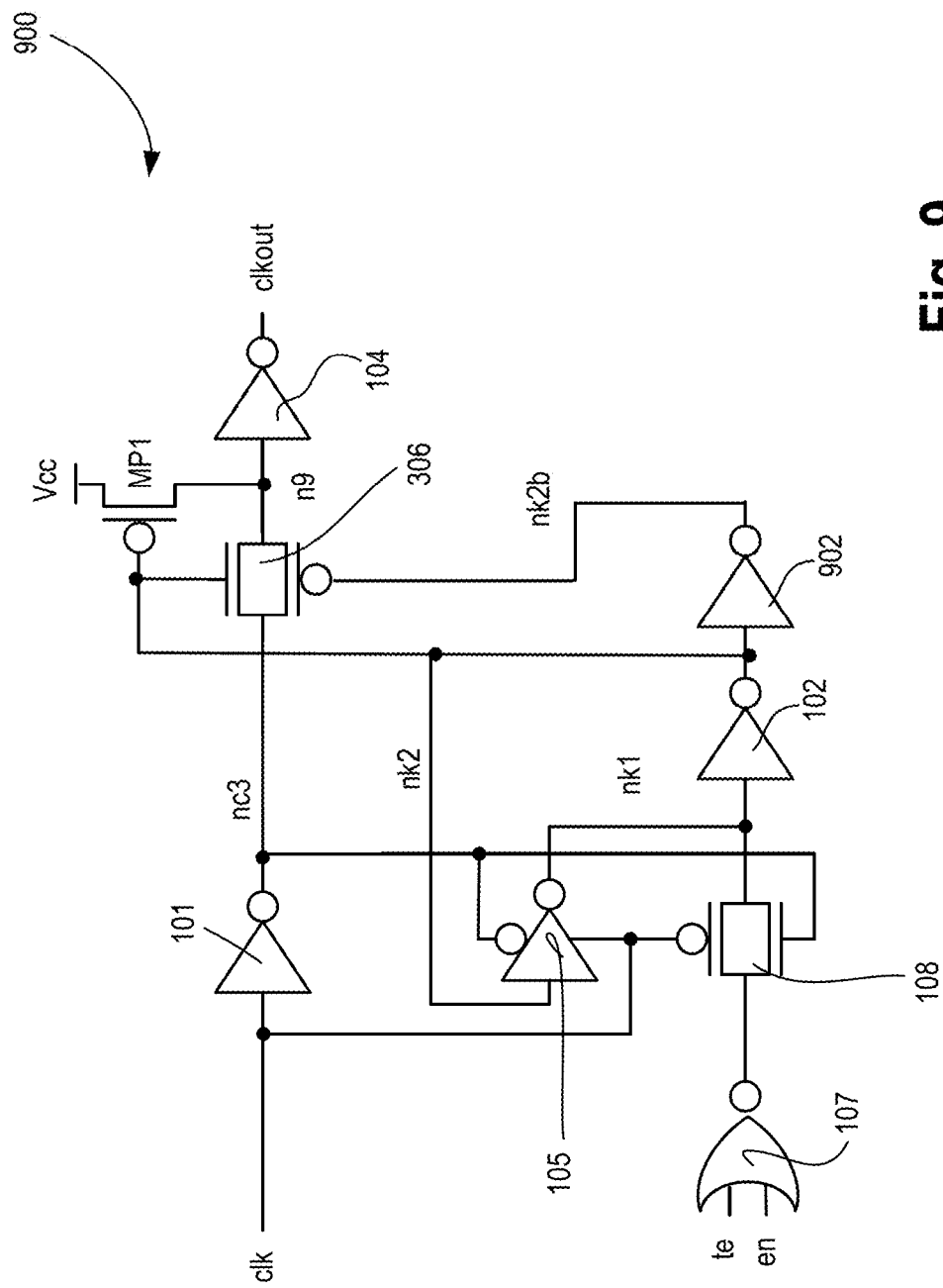
FIG. 9 illustrates a pass-gate based ICG circuit with AND logic, in accordance with some embodiments.

FIG. 9 illustrates a pass-gate based ICG circuit 900 with AND logic, in accordance with some embodiments. ICG 900 is similar to ICG 300 but for additional inverter delay added by inverter 902 to control pass-gate 306. In some embodiments, output nk2 of inverter 102 is coupled to input of inverter 902, and the output nk2b of inverter 902 is used to drive the p-type transistor of pass-gate 306. In some embodiments, output nk2 is used to drive transistor MP1 and n-type transistor 306 of pass-gate 306. As such, transistor size of tri-state inverter 105 can be reduced to further reduce clock loading on node clk. Operation wise, ICG circuit 900 operates similarly to ICG circuit 300.

Figure 10:
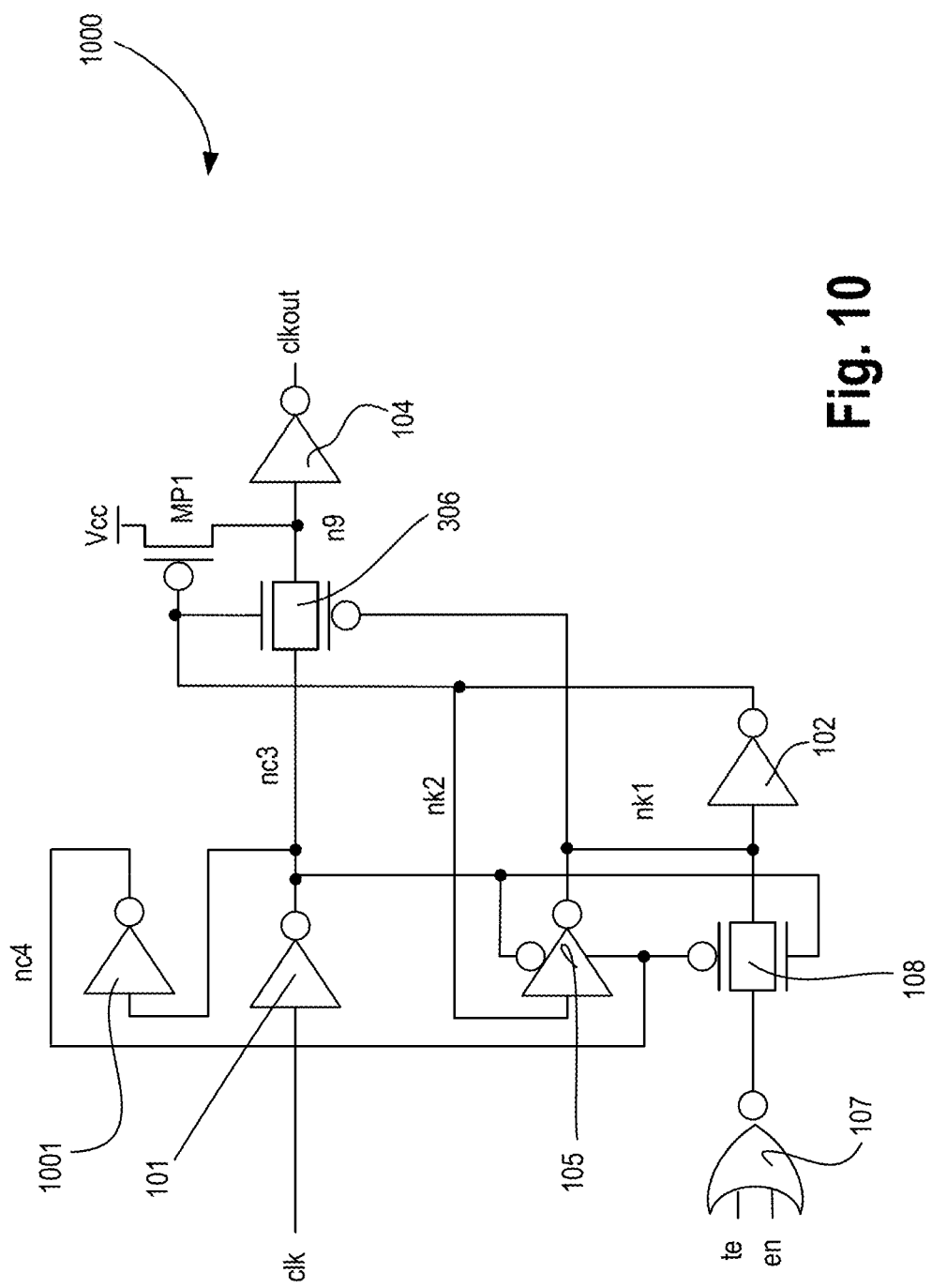
FIG. 10 illustrates a pass-gate based ICG circuit with AND logic, in accordance with some embodiments.

FIG. 10 illustrates a pass-gate based ICG circuit 1000 with AND logic, in accordance with some embodiments. ICG circuit 1000 is similar to ICG circuit 300 but for additional inverter 1001 couples to inverter 101 at node nc3. In some embodiments, output nc4 of inverter 1001 is used for controlling pass-gate 108 and tri-state inverter 105. Operation wise, ICG circuit 1000 operates similarly to ICG circuit 300.

Figure 11:
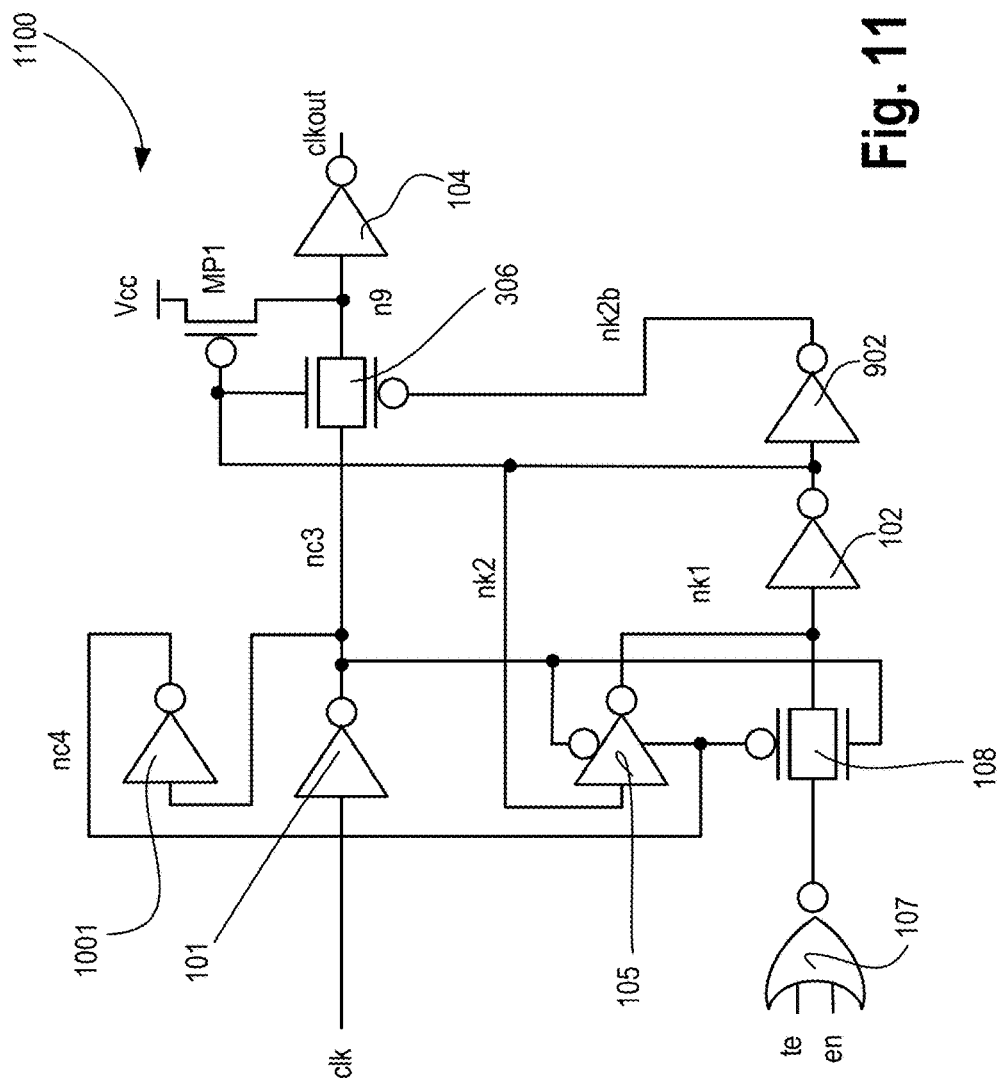
FIG. 11 illustrates an ICG circuit which is a combination of the ICG circuits of FIG. 9 and FIG. 10, in accordance with some embodiments of the disclosure.

FIG. 11 illustrates an ICG circuit 1100 which is a combination of the ICG circuits of FIG. 9 and FIG. 10, in accordance with some embodiments of the disclosure. For example, inverter 902 is added to drive pass-gate 306, and inverter 1001 is added to control tristate-able inverter 105 and pass-gate 108. Operation wise, ICG circuit 1100 operates similarly to ICG circuit 300.

Figure 12:
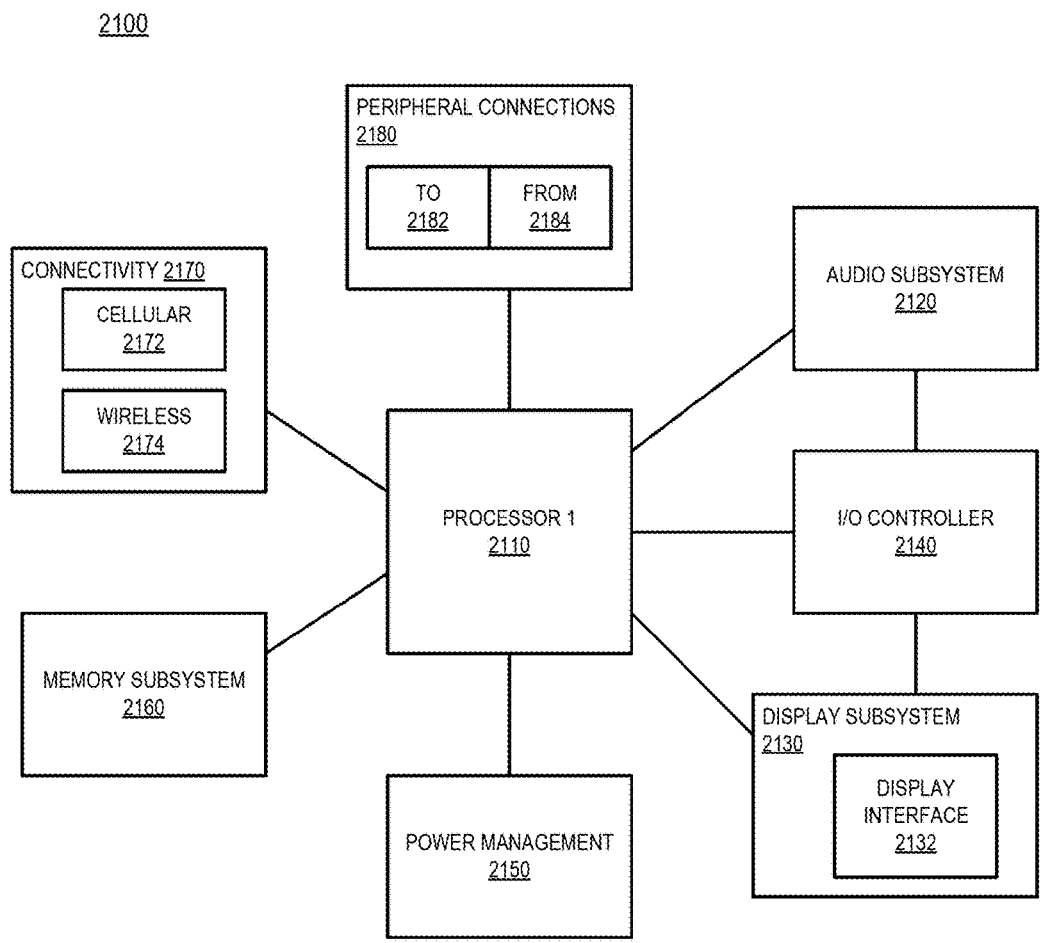
FIG. 12 illustrates a smart device or a computer system or a SoC (System-on-Chip) with pass-gate based integrated clock gate circuit with AND and/or OR logic, in accordance with some embodiments.

FIG. 12 illustrates a smart device or a computer system or a SoC (System-on-Chip) with pass-gate based integrated clock gate circuit with AND and/or OR logic, in accordance with some embodiments.

In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 with pass-gate based integrated clock gate circuit with AND and/or OR logic, according to some embodiments discussed. Other blocks of the computing device 2100 may also include the pass-gate based integrated clock gate circuit with AND and/or OR logic according to some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. The various examples associated with each example set may include features from other examples of the same set just like multiple dependent claims of a claim set.

Example 1

An apparatus comprising: a first inverter to receive a clock; a pass-gate coupled to the first inverter; a second inverter coupled to the pass-gate and to provide an output clock; and a device coupled to the second inverter and the pass-gate, wherein the device and the pass-gate are controllable by a logic that depends on logic values of at least two signals including an enable and the clock.

Example 2

The apparatus of example 1, wherein the pass-gate is a first pass-gate, wherein the apparatus comprises a second pass-gate controllable by the clock, and wherein the second pass-gate is coupled to an input of the second inverter.

Example 3

The apparatus of example 2 comprises a NOR gate coupled to the second pass-gate, wherein the NOR gate is to provide an output to the second pass-gate according to a test mode and the enable.

Example 4

The apparatus of example 2 comprises a tristate-able inverter having an output coupled to the first pass-gate, wherein the tristate-able inverter is controllable by the clock.

Example 5

The apparatus of example 4, wherein the second inverter is coupled to the tri-statable inverter.

Example 6

The apparatus of example 1, wherein the device is a p-type device.

Example 7

The apparatus of example 1, wherein the pass-gate is a first pass-gate, and wherein the logic comprises a NOR gate, a tristate-able inverter, and a second pass-gate.

Example 8

An apparatus comprising: a first inverter to receive a clock; a second inverter coupled in series with the first inverter; a pass-gate coupled to the second inverter; and a device coupled to the pass-gate, wherein the device and the pass-gate are controllable by a logic that depends on logic values of at least two signals including an enable and the clock.

Example 9

The apparatus of example 8, wherein the device is a p-type device.

Example 10

The apparatus of example 8, wherein the pass-gate is a first pass-gate, and wherein the logic comprises a NOR gate, a tristate-able inverter, and a second pass-gate.

Example 11

The apparatus of example 8, wherein the pass-gate is a first pass-gate, and wherein the apparatus comprises a second pass-gate coupled to an output of the second inverter.

Example 12

The apparatus of example 11 comprises a NOR gate coupled to the second pass-gate, wherein the NOR gate is to provide an output to the second pass-gate according to a test mode and the enable.

Example 13

The apparatus of example 11 comprises a tristate-able inverter having an output coupled to the first pass-gate and the device, wherein the tristate-able inverter is controllable by an output of the second clock.

Example 14

A system comprising: a memory; a processor coupled to the memory, the processor including: a clock distribution network having a clock gating circuitry which includes: a first inverter to receive a clock; a pass-gate coupled to the first inverter; a second inverter coupled to the pass-gate and to provide an output clock; and a device coupled to the second inverter and the pass-gate, wherein the device and the pass-gate are controllable by a logic that depends on logic values of at least two signals including an enable and the clock; a flip-flop to receive the output clock to sample data; and a wireless interface to allow the processor to communicate with another device.

Example 15

The system of example 14, wherein the pass-gate is a first pass-gate, wherein the apparatus comprises a second pass-gate controllable by the clock, and wherein the second pass-gate is coupled to an input of the second inverter.

Example 16

The system of example 15 comprises a NOR gate coupled to the second pass-gate, wherein the NOR gate is to provide an output to the second pass-gate according to a test mode and the enable.

Example 17

The system of example 15 comprises a tristate-able inverter having an output coupled to the first pass-gate, wherein the tristate-able inverter is controllable by the clock.

Example 18

The system of example 14, wherein the second inverter is coupled to the tristate-able inverter.

Example 19

The system of example 14, wherein the device is a p-type device.

Example 20

The system of example 14, wherein the pass-gate is a first pass-gate, and wherein the logic comprises a NOR gate, a tristate-able inverter, and a second pass-gate.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first inverter to receive a clock;
   a first pass-gate coupled to the first inverter;
   a second inverter coupled to the first pass-gate and to provide an output clock;
   a transistor coupled to the second inverter and the first pass-gate, wherein the transistor and the first pass-gate are controllable by a logic that depends on logic values of at least two signals including an enable and the clock, and wherein a gate of the transistor is coupled to a gate of the first pass-gate; and
   a second pass-gate controllable by the clock, wherein the second pass-gate is coupled to an input of the second inverter, and wherein the clock is received by a gate of the second pass-gate.

2. The apparatus of claim 1 comprises a NOR gate coupled to the second pass-gate, wherein the NOR gate is to provide an output to the second pass-gate according to a test mode and the enable.

3. The apparatus of claim 1 comprises a tristate-able inverter having an output coupled to the first pass-gate, wherein the tristate-able inverter is controllable by the clock.

4. The apparatus of claim 3, wherein the second inverter is coupled to the tristate-able inverter.

5. The apparatus of claim 1, wherein the transistor is a p-type device.

6. The apparatus of claim 1, wherein the pass-gate is a first pass-gate, and wherein the logic comprises a NOR gate, a tristate-able inverter, and the second pass-gate.

7. An apparatus comprising:
   a first inverter to receive a clock;
   a second inverter coupled in series with the first inverter;
   a first pass-gate coupled to the second inverter;
   a device coupled to the first pass-gate, wherein a gate of the device is coupled to a gate of the first pass-gate, and wherein the device and the first pass-gate are controllable by a logic that depends on logic values of at least two signals including an enable and the clock; and
   a second pass-gate coupled to an output of the second inverter, wherein a gate of the second pass-gate is controllable by the output of the second inverter.

8. The apparatus of claim 7, wherein the device is a p-type device.

9. The apparatus of claim 7, wherein the logic comprises a NOR gate and a tristate-able inverter, and the second pass-gate.

10. The apparatus of claim 7 comprises a NOR gate coupled to the second pass-gate, wherein the NOR gate is to provide an output to the second pass-gate according to a test mode and the enable.

11. The apparatus of claim 7 comprises a tristate-able inverter having an output coupled to the first pass-gate and the device, wherein the tristate-able inverter is controllable by an output of the second inverter.

12. A system comprising:
   a memory;
   a processor coupled to the memory, the processor including:
      a clock distribution network having a clock gating circuitry which includes:
         a first inverter to receive a clock;
         a first pass-gate coupled to the first inverter;
         a second inverter coupled to the first pass-gate and to provide an output clock;
         a transistor coupled to the second inverter and the first pass-gate, wherein the transistor and the first pass-gate are controllable by a logic that depends on logic values of at least two signals including an enable and the clock a second pass-gate controllable by the clock, wherein the second pass-gate is coupled to an input of the second inverter, and wherein the clock is received by a gate of the second pass-gate; and
      a flip-flop to receive the output clock to sample data; and
   a wireless interface to allow the processor to communicate with another device.

13. The system of claim 12 comprises a NOR gate coupled to the second pass-gate, wherein the NOR gate is to provide an output to the second pass-gate according to a test mode and the enable.

14. The system of claim 12 comprises a tristate-able inverter having an output coupled to the first pass-gate, wherein the tristate-able inverter is controllable by the clock.

15. The system of claim 12, wherein the second inverter is coupled to the tristate-able inverter.

16. The system of claim 12, wherein the transistor is a p-type device.

17. The system of claim 12, wherein the pass-gate is a first pass-gate, and wherein the logic comprises a NOR gate, a tristate-able inverter, and the second pass-gate.

* * * * *